US009886419B2

United States Patent
Follett et al.

(10) Patent No.: US 9,886,419 B2
(45) Date of Patent: Feb. 6, 2018

(54) SYSTEM FOR IMPROVING PROBABILITY OF TRANSIENT EVENT DETECTION

(75) Inventors: Stephen D. Follett, Tigard, OR (US); Steven W. Stanton, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 832 days.

(21) Appl. No.: 13/559,363

(22) Filed: Jul. 26, 2012

(65) Prior Publication Data
US 2014/0032150 A1 Jan. 30, 2014

(51) Int. Cl.
G06F 17/18 (2006.01)
G01R 13/02 (2006.01)

(52) U.S. Cl.
CPC ......... G06F 17/18 (2013.01); G01R 13/0263 (2013.01)

(58) Field of Classification Search
CPC .............................. G06F 17/18; G01R 13/0263
See application file for complete search history.

(56) References Cited

U.S. PATENT DOCUMENTS

| 6,269,317 | B1 | 7/2001 | Schachner et al. | |
|---|---|---|---|---|
| 8,396,688 | B2* | 3/2013 | Samdani et al. | 702/180 |
| 2003/0143951 | A1* | 7/2003 | Challa | H04L 27/0014 455/20 |
| 2004/0017371 | A1* | 1/2004 | Shen | G01R 13/0263 345/440 |
| 2007/0211786 | A1* | 9/2007 | Shattil | 375/141 |
| 2008/0079623 | A1 | 4/2008 | Xu | |
| 2010/0061437 | A1 | 3/2010 | Samdani et al. | |
| 2011/0270560 | A1 | 11/2011 | Wang et al. | |
| 2012/0110402 | A1* | 5/2012 | Wang | G01R 31/318558 714/729 |

FOREIGN PATENT DOCUMENTS

| CN | 101144835 A | 3/2008 |
|---|---|---|
| CN | 101281224 A | 10/2008 |
| CN | 101706521 A | 5/2010 |

(Continued)

OTHER PUBLICATIONS iPhone 3GS product released 2009; http://www.gsmarena.com/apple_iphone_3gs-2826.php.*
Tektronix, "The XYZs of Logic Analyzers", 2008.*

*Primary Examiner* — Regis Betsch
(74) *Attorney, Agent, or Firm* — Marger Johnson; Kevin Dothager

(57) ABSTRACT

A test and measurement instrument provides for increased transient event detection by adjusting data sampling periods. The test and measurement instrument includes a data sampler for acquiring first sampled data and a data processor structured to process the first sampled data. The data processor operates during a first data processing period. Also included in the instrument is a sample time adjustor structured to allow a user to select a time for the data sampler to acquire second sampled data. The time for the data sampler to acquire the second sampled data occurs during the first data processing period. The time for acquiring the second sampled data may be determined by generating a probability distribution function, then applying the distribution function to the available times during the first data processing period that the second sample data may be collected. Methods of use of the test and measurement instrument are also provided.

16 Claims, 7 Drawing Sheets

(56) References Cited

FOREIGN PATENT DOCUMENTS

| | | |
|---|---|---|
| CN | 201548603 U | 8/2010 |
| CN | 102053184 A | 5/2011 |
| JP | H04309871 | 11/1992 |
| JP | H11237277 | 2/1998 |
| JP | H1144710 A | 2/1999 |
| JP | 2009006862 A | 1/2009 |

* cited by examiner

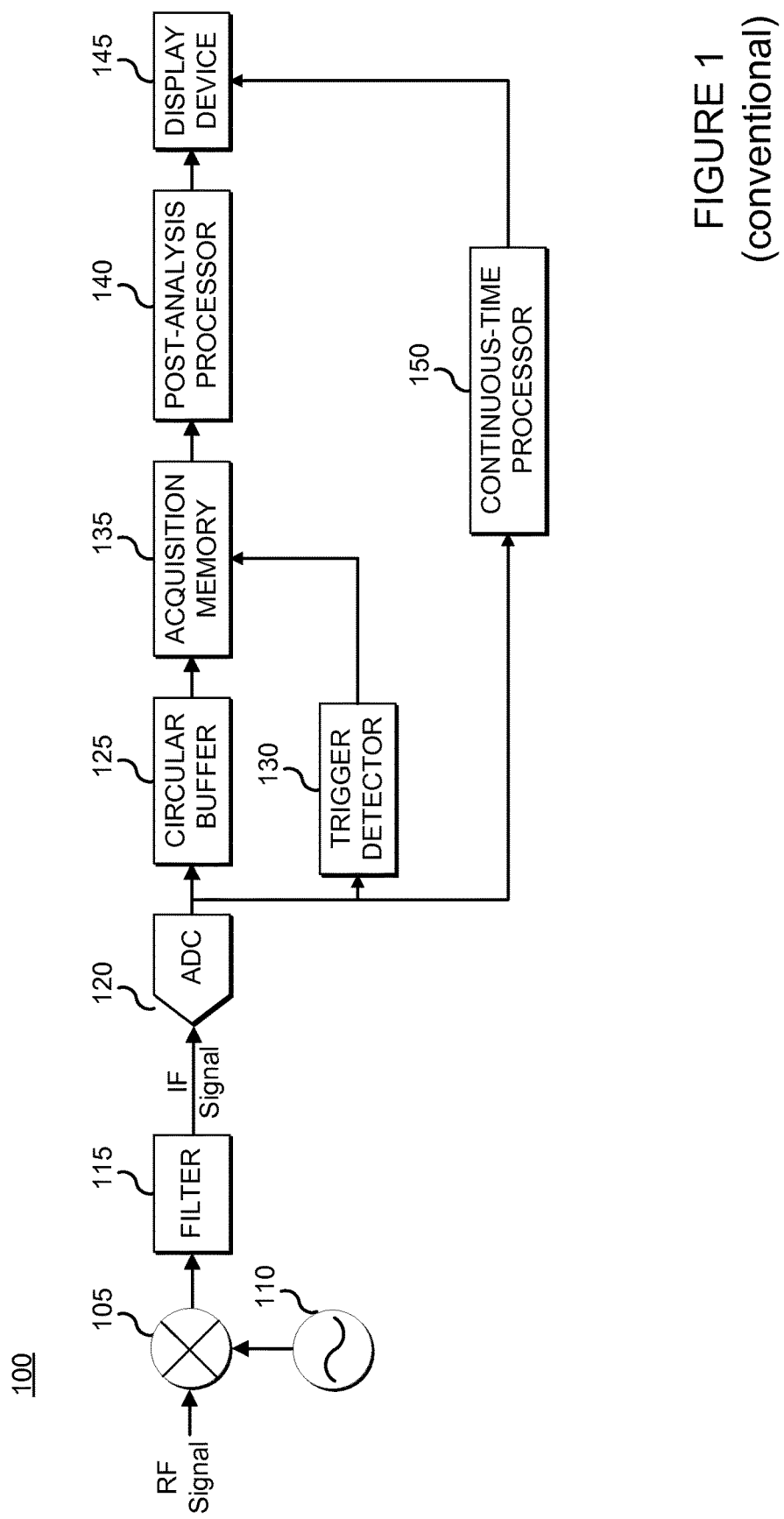
FIGURE 1
(conventional)

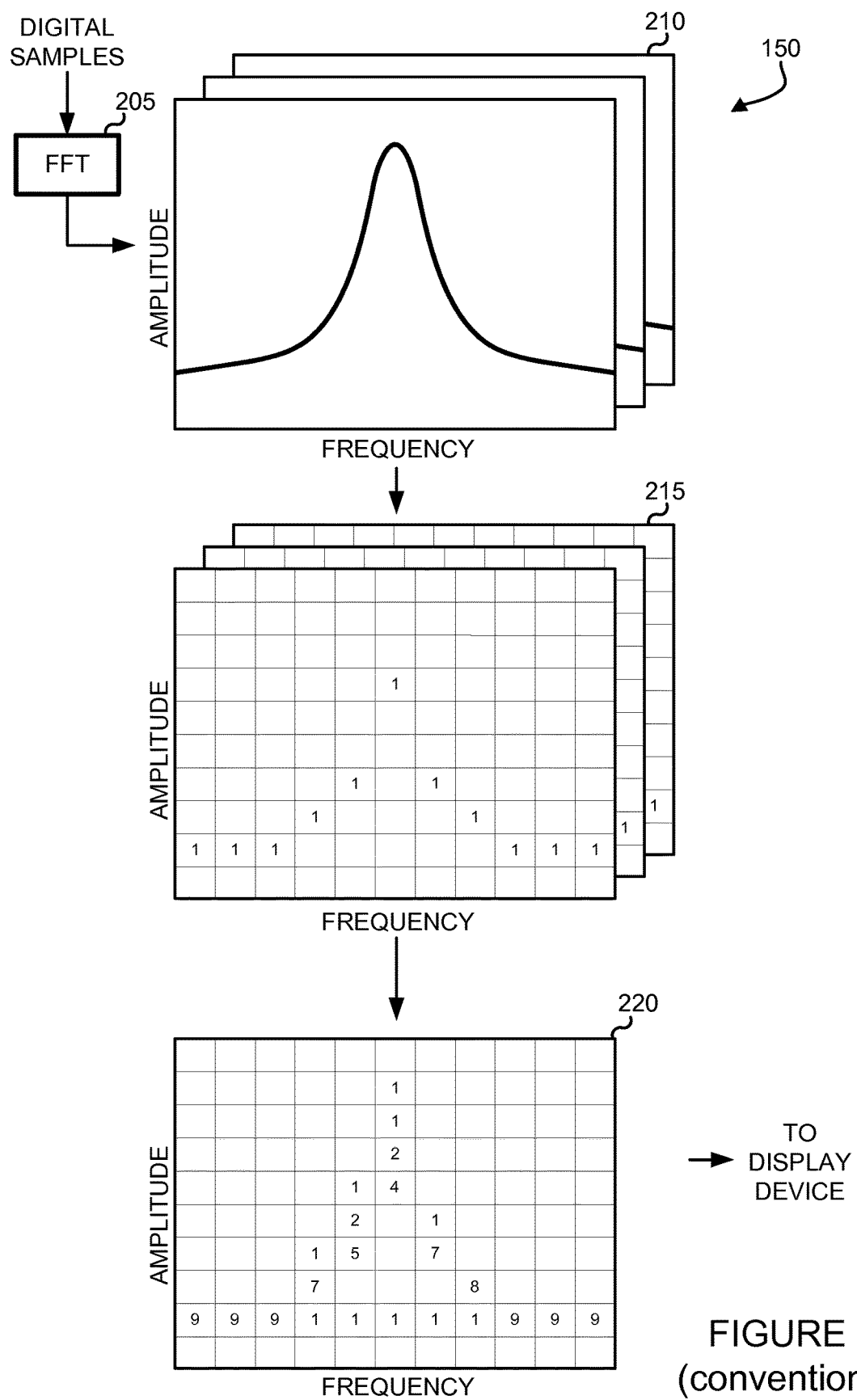
FIGURE 2
(conventional)

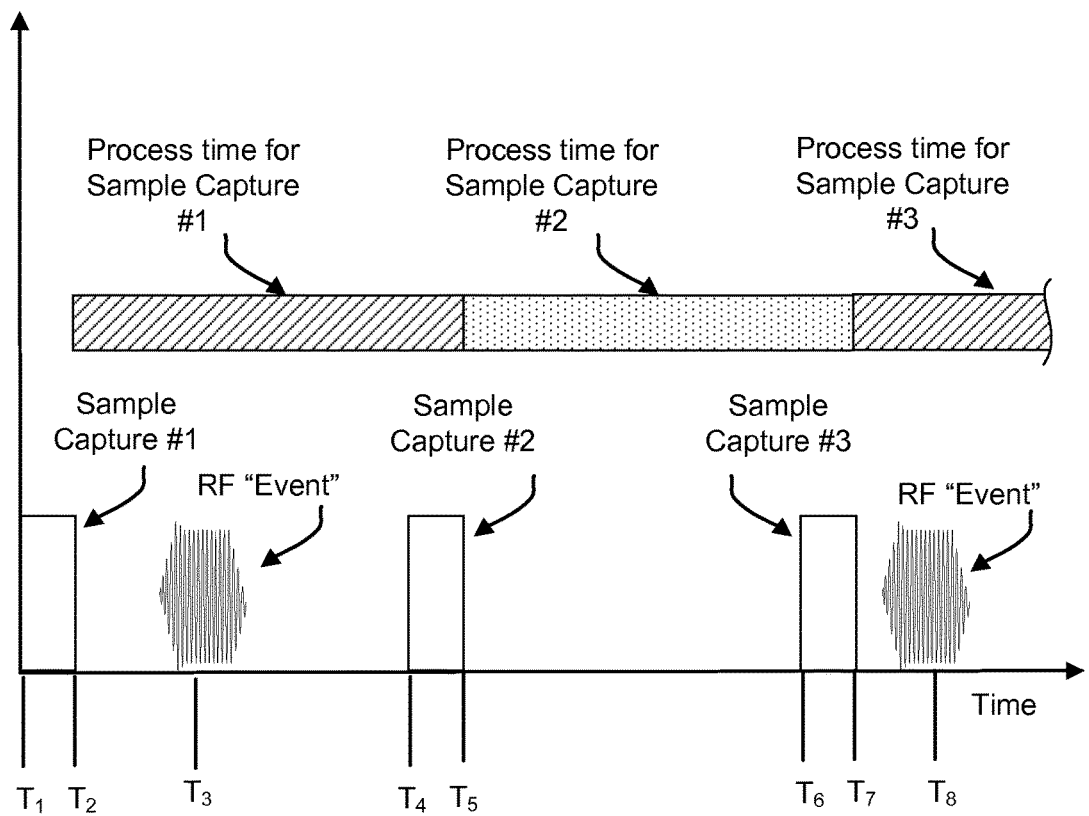
FIGURE 3
(conventional)

SYSTEM FOR IMPROVING PROBABILITY OF TRANSIENT EVENT DETECTION

FIELD OF THE INVENTION

This disclosure is directed toward test and measurement instruments, and, more particularly, to instruments having an enhanced probability of detecting a transient event.

BACKGROUND

Real-time spectrum analyzers such as the RSA6100, RSA5100, and RSA3400 families available from Tektronix, Inc. of Beaverton, Oreg. trigger on, capture, and analyze RF signals in real-time. These test and measurement instruments seamlessly capture RF signals so that, unlike conventional swept spectrum analyzers and vector signal analyzers, no data is missed within a specified bandwidth.

Referring now to FIG. 1, a real-time spectrum analyzer 100 receives a radio frequency (RF) input signal and optionally down-converts it using a mixer 105, local oscillator (LO) 110, and filter 115 to produce an intermediate frequency (IF) signal. An analog-to-digital converter (ADC) 120 digitizes the IF signal to produce a continuous stream of digital samples. The digital samples are input to a circular buffer 125 and also input to a trigger detector 130 that processes the digital samples in real-time and compares the processed samples to a user-specified trigger threshold. When the processed digital samples violate the trigger threshold, the trigger detector 130 generates a trigger signal that causes an acquisition memory 135 to store the digital samples held in the circular buffer 125. "Violate" means either "exceeds" or "is less than," depending on a user-specified parameter. The stored digital samples are then analyzed by a post-analysis processor 140, and the results may be displayed on a display device 145 or stored in a storage device (not shown).

Tektronix real-time spectrum analyzers use a technology referred to as "Digital Phosphor" or alternatively as "DPX". A DPX-enabled real-time spectrum analyzer uses a continuous-time processor 150 to process the continuous stream of digital samples from the ADC 120 in real-time and display the results on the display device 145. Referring now to FIG. 2, the continuous-time processor 150 uses a frequency transform 205 such as a fast Fourier transform (FFT), a chirp-Z transform, or the like to transform the continuous stream of digital samples into thousands of spectra 210 every second. Other data processes may also be performed. The spectra 210 are then combined to form a data structure referred to as a "bitmap database" 220. In one embodiment, each spectrum 210 is rasterized to produce a "rasterized spectrum" 215. A rasterized spectrum comprises an array of cells arranged in of a series of rows and columns, with each row representing a particular amplitude value and each column representing a particular frequency value. The value of each cell is either a "1," also referred to as a "hit," which indicates that the input signal was present at that particular location in the amplitude versus frequency space during the measurement period, or a "0" (depicted as a blank cell in the Drawings), which indicates that it was not. The values of the corresponding cells of the rasterized spectra 215 are summed together to form the bitmap database 220, and then the value of each cell of the bitmap database 220 is divided by the total number of rasterized spectra 215 so that it indicates the total number of hits during the measurement period divided by the total number of rasterized spectra 215, or equivalently, the percentage of time during the measurement period that the input signal occupied that particular location in the amplitude versus frequency space, also referred to as the "DPX Density".

The rasterized spectra 215 and the bitmap database 220 are depicted in the Drawings as having 10 rows and 11 columns for simplicity, however it will be appreciated that in an actual embodiment, the rasterized spectra 215 and the bitmap database 220 may have hundreds of columns and rows. The bitmap database 220 is essentially a three-dimensional histogram, with the x-axis being frequency, the y-axis being amplitude, and the z-axis being density. The bitmap database 220 may be displayed as an image referred to as a "bitmap" on the display device 145, with the density of each cell being represented by a color-graded pixel. Alternatively, the bitmap database 220 may be stored in a storage device (not shown).

DPX acquisition and display technology reveals signal details such as short-duration or infrequent events that are completely missed by conventional spectrum analyzers and vector signal analyzers. For more information on DPX, see Tektronix document number 37W-19638 titled "DPX Acquisition Technology for Spectrum Analyzers Fundamentals" dated Aug. 20, 2009, available at http://www.tek.com/. In other embodiments, the spectra may be fed to a triggering system, comparing each spectra to a pre-defined trigger mask, which may define user-selectable amplitudes and frequency limits. When the signal under test violates the trigger mask, the acquisition memory stores incoming data. Triggers may also be defined using statistics of the color bitmap, so that a trigger may be created whenever a signal is present more or less frequently than a defined percentage of time.

With this background, the advantages and other novel features of the present invention are apparent from the following detailed description when read in conjunction with the appended claims and attached drawings.

SUMMARY OF THE INVENTION

The above-described system works well for capturing transient signals with no time gaps when the frequency transform processing time is on the same order as the time required to capture a buffer of data upon which the frequency transform is performed. As data acquisition sample rates increase, however, giving marked increased acquisition bandwidth, the ability to process frequency transforms lags. In other words, the time it takes to process the frequency transforms of the sampled data exceeds the data acquisition rate. This creates "gaps" in time during which data is being processed while no input data is being captured. This problem worsens as the processing time increases. When the sample rates of the ADC approach an order of magnitude faster than the frequency transform processing rates, the gaps between the acquired capture buffers become noticeable. In some instances, short, transient signals may appear on the device under test while the instrument is in a gap period. In such instances, the transient signal will not be detected by the instrument.

Embodiments of the invention address such limitations by allowing the data acquisition period to be adjusted relative to the processing period, thereby increasing the chances of detecting transient signals.

Accordingly, embodiments of the invention are directed to a test and measurement instrument that includes a data sampler for acquiring first sampled data and a data processor structured to perform a process on the first sampled data. The process may be a frequency transform, for example. The data processor operates during a first data processing period. Also included in the instrument is a sample time adjustor structured to allow a user to select a time for the data sampler to acquire second sampled data. The time for the data sampler to acquire the second sampled data occurs during the first data processing period. The time for acquiring the second sampled data may be determined by generating a probability distribution function, then applying the distribution function to the available times during the first data processing period that the second sample data may be collected.

Other embodiments include a method for use in a test and measurement device. The method includes accepting first sampled data for testing and performing a data process on the first sampled data during a data processing period. Then the method accepts from a user an indication to acquire second sampled data for testing before the end of the data processing period. The method may include calculating a probability distribution function and applying it to the time period for collection.

BRIEF DESCRIPTION OF THE DRAWINGS

FIG. 1 is a functional block diagram of a conventional real-time spectrum analyzer.

FIG. 2 is a functional block diagram illustrating operation of the continuous-time processor component illustrated in FIG. 1.

FIG. 3 is a timing diagram of a conventional data sampling system showing gaps between data sampling times and the associated process times of the sampled data.

DETAILED DESCRIPTION

FIG. 3 is a timing diagram a conventional data sampling system showing gaps caused by long data processing times. Three periods of sample capture are shown, during which times a test and measurement instrument is sampling data. For example, sample capture 1 is received during times T1 and T2, sample capture 2 is received during times T4 and T5, and sample capture 3 is received during times T6 and T7. The data processing times, such as, for example, frequency transforms, take longer periods of time than the capture times. For example, sample capture 1 is captured during times T1 and T2, and the data is processed during times T2 and T5. Note that an RF event occurs at T3, which is during a period while the processing is taking place but no data is being sampled. Therefore the test and measurement instrument misses the detection of the RF event at T3.

Referring back to FIG. 1, when the sample times of the ADC 120 approach an order of magnitude faster than the frequency transform processing rates, the gaps between acquired capture buffers may become noticeable. For example, capturing a 1K buffer of data from the ADC 120 that is sampling at 3.125 Gsps (Giga samples per second) will capture approximately 327.7 ns in time. Modern FPGA (Field Programmable Gate Arrays), upon which many instruments are built, can process conventional frequency transforms using an approximately 400 MHz clock rate, which is the processing rate of typical FPGAs. For a conventional transform that produces one sample output per clock, the time to process a 1K FFT (Fast Fourier Transform), for instance, is approximately 2560 ns. Assuming the FFTs can be processed sequentially, with no pre-charge time, and assuming the time samples are captured immediately prior to beginning the FFT, as is the case in present instruments, the gap in time between consecutively captured buffers would be 2560 ns-327.7 ns, which means that the test and measurement instrument in this example spends approximately 87% of a sample/process cycle not sampling data. In other words, in such a case, the instrument is blind to RF events occurring during these gap periods.

Figure 4:
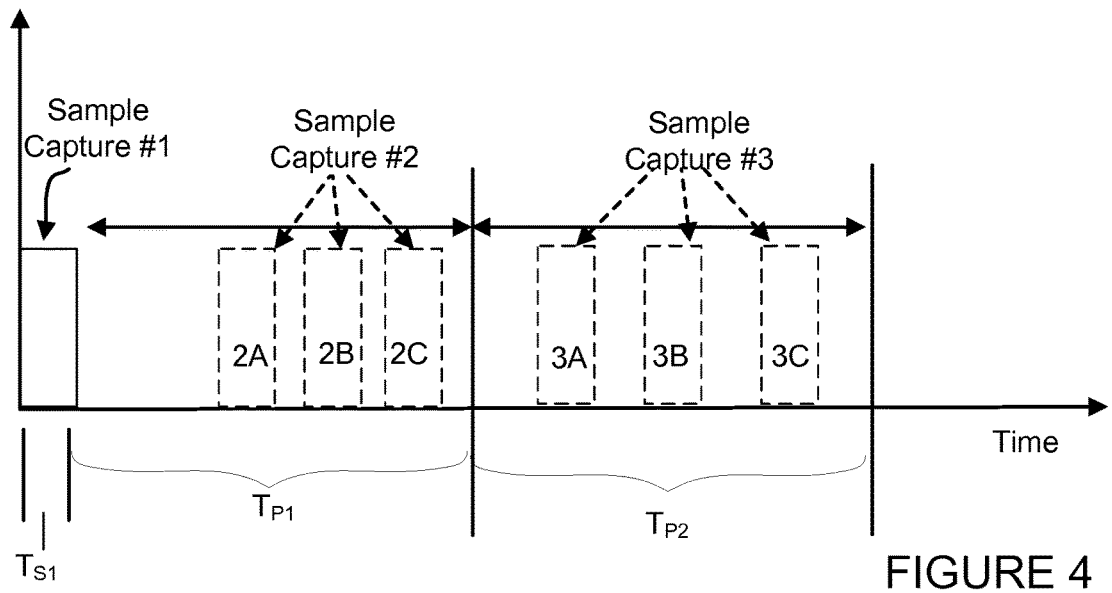
FIG. 4 is a timing diagram illustrating how sample times may be adjusted within the processing window according to embodiments of the invention.

Typical measurement systems maintain timing synchronicity between the systems under test and the measurement system. This is normally accomplished by sharing a common frequency reference to phase lock the two systems together. Embodiments of the invention, however, allow the capture period to be moved to any time period during the time the measurement system is processing the previously captured data. For example, with reference to FIG. 4, a system according to embodiments of the invention is illustrated. The sample capture 1 begins at a time zero, and occurs during a sample time TS1. In a typical system, the second sample would not be sampled until the processor has finished processing the data sampled during TS1. Embodiments of the invention, however, include a system that allows the sample capture 2 to be sampled earlier than requiring it to wait until the system has completely processed the first sample. For example, the data may be captured in sample capture 2 at the position illustrated as 2A, 2B, or 2C. Likewise, the data may be captured in sample capture 3 at the position 3A, 3B, or 3C, or any time during the processing window TP2. Embodiments of the invention allow the next sample to be taken at any time during the processing time of the previous sample, and do not force the sample to be taken at a time just as the data processor is ready to receive the next sample, as is conventional. Embodiments of the invention are not limited to periods during which only frequency transforms are being processed, but may operate with any data processing where the processing of the sampled data takes much longer than the data sampling itself.

Figure 5:
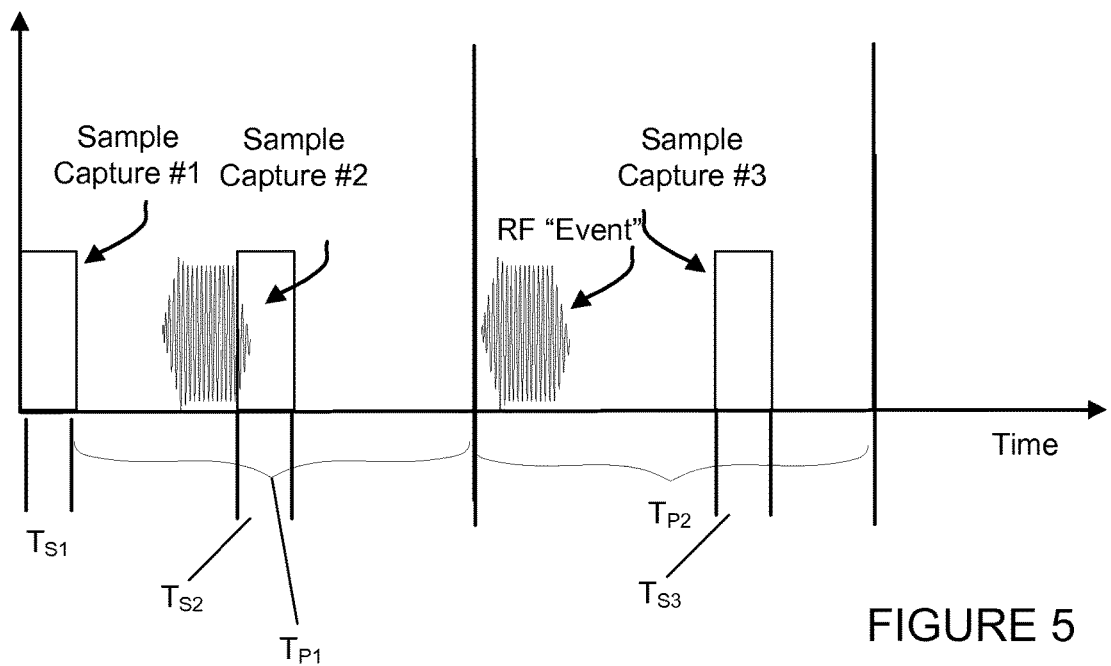
FIG. 5 is a timing diagram illustrating changed sample times within the processing window according to embodiments of the invention.

FIG. 5 illustrates the advantage of such a system. As shown in FIG. 5, by moving the sample capture 2 earlier in the time period during which the sample capture 1 is being processed, illustrated as TS2, the sample capture 2 is active during the RF event. Compare this result to the conventional system illustrated in FIG. 3, where the RF event at T3 was missed because the measurement system was not currently sampling data.

The apparatus according to embodiments of the invention "moves" the sample capture forward in time to enable the capture of events that fall within the gap time.

Figure 6:
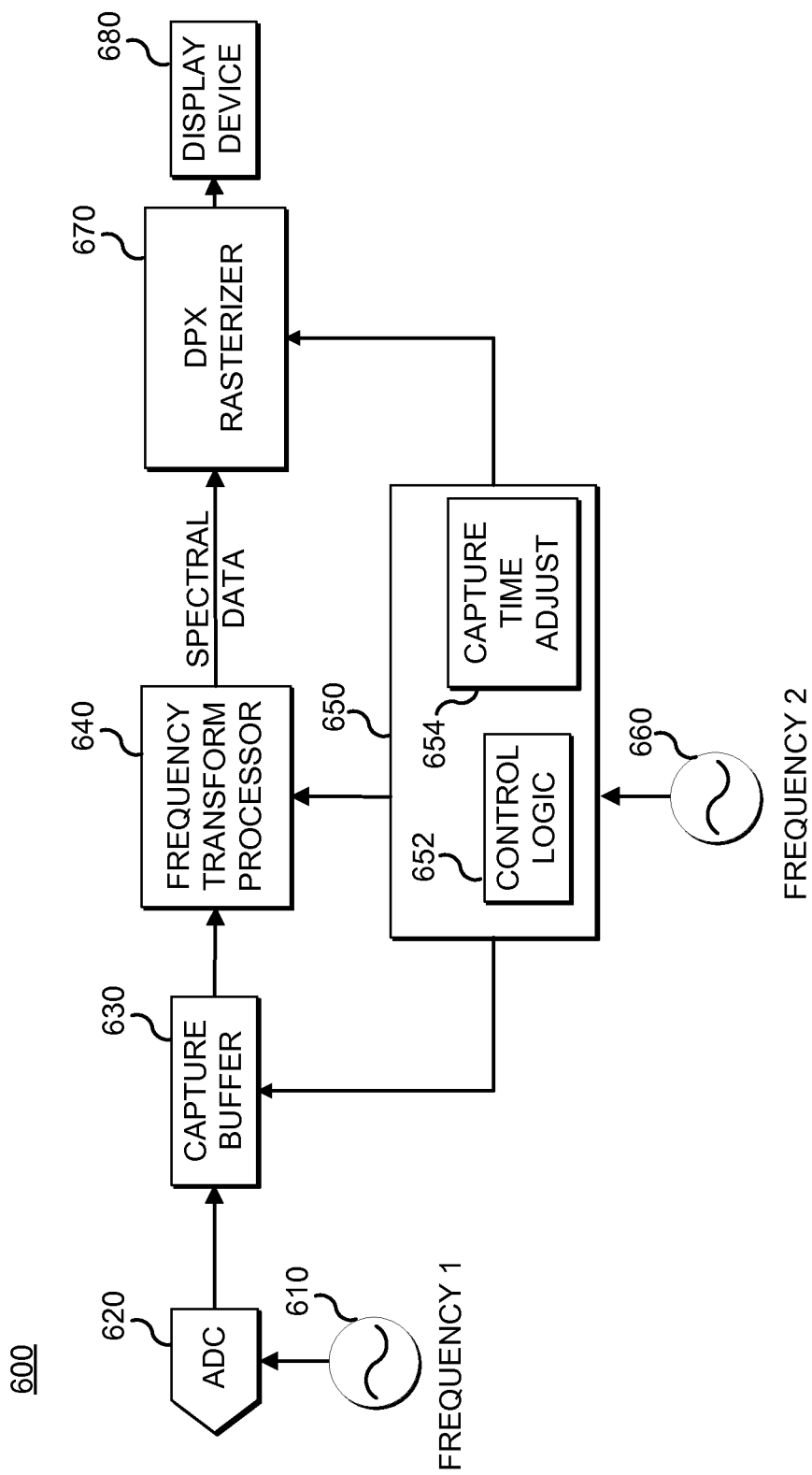
FIG. 6 is a functional block diagram of a sample acquisition and transform processing engine having variable sample times according to embodiments of the invention.

The user may control the sampling timing capture variation using, for example, a capture time adjustor 654 illustrated in FIG. 6. The user may modify the sample timing by controlling a knob or slider, for example, or the user may select timing modification from a menu selection. Methods of user input to a test and measurement device are well known.

Figure 7:
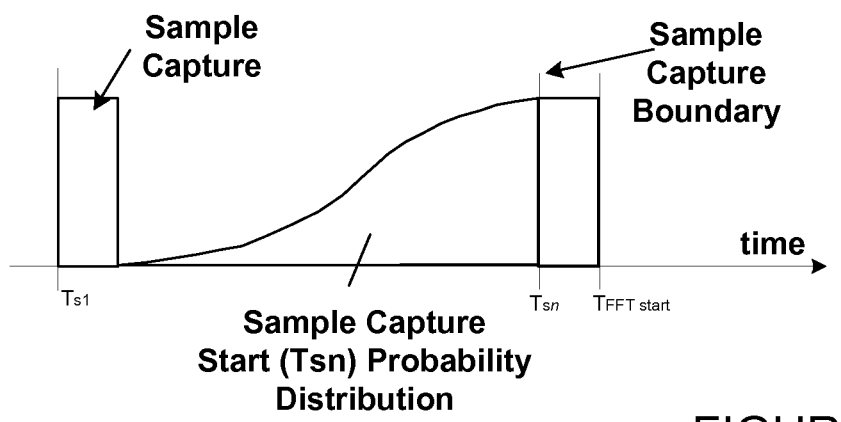
FIG. 7 is a diagram illustrating probabilities of samples being captured during particular times within a processing window according to embodiments of the invention.

In other embodiments, the user need not select a specified time for the data sample to occur, but may cause the test and measurement instrument to automatically vary the sample times between the adjustable periods. For example the user may be able to select a probability function, such as that illustrated in FIG. 7. In that figure, a first sample period is illustrated at TS1, and the conventional sample period for the second sample is illustrated at TSN. Between TS1 and TSN is illustrated a probability function showing a probability that a sample "n" may be taken at any particular time between TS1 and TSN. Illustrated here is the first half of a Gaussian distribution, although other distributions are possible. For example, other probability functions may include Cosine, Laplace, Linear, Uniform, or random. These probability functions may be implemented by look up table, or by a real-time calculation using a probability distribution function (PDF) formula. In other words, because so many samples of data may be collected, as described above, varying the sample times between different sample data capture periods may allow the user a higher probability of detecting transient events, especially those transient events that are periodic and have a frequency that aligns with the processing times TP1, TP2 etc. of FIG. 4, for example.

The user may control the limits of excursion for the sample timing capture variation. For example, the user may specify that the second capture period should not occur before 10-25% of the processing time of the previous data has passed. Other limits are also possible.

The change in the sample time may be in relation to the processing time boundaries, or related to an external timing or trigger signal. If the signal statistics of the tested signal are known, there may be advantages by shaping the PDF function of the capture start time in relation to the known statistics.

FIG. 6 illustrates a sample acquisition and transform processing engine according to embodiments of the invention. Common elements are not described for brevity. The ADC 620 produces data at the sample rate Frequency 1, which is captured into the sample capture buffer 630. The data is then transferred to a frequency transform processor 640 at the processing rate Frequency 2. In a conventional test and measurement system, control logic 652 causes the data to be captured at uniform intervals, and specifically at intervals that immediately precede their use in the transform processor 640. Embodiments of the invention, differently, include the capture time adjust 654, as described above, which allows the user to modify when the data sample will occur.

Figure 8:
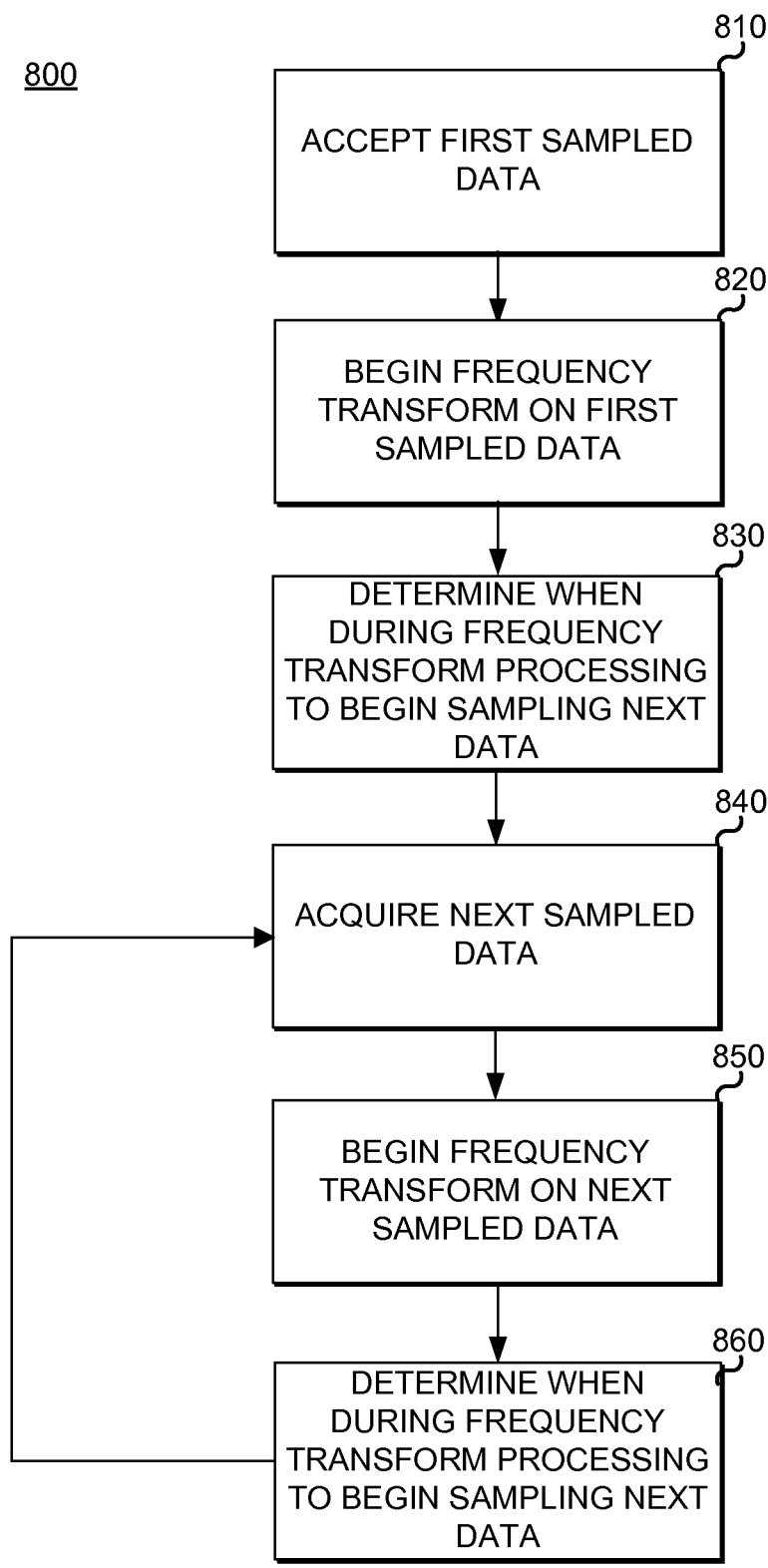
FIG. 8 is a flow diagram illustrating example methods according to embodiments of the invention.

FIG. 8 is a flow diagram illustrating example processes used in embodiments of the invention. In an operation 810, first data is accepted for sampling in a test and measurement instrument as described above, and the processing for the first sampled data begins in an operation 820. The processing may include performing a frequency transform, as shown, or the data processing may include other processes.

In an operation 830, the test and measurement instrument determines when to sample the next data. This determination may be based on a user-defined parameter, or may be generated by the test and measurement instrument, as described above. Also as described above, the particular time for sampling the next data may be generated by calculating a probability distribution function and selecting the time to begin generating the next data based on that function. The test and measurement instrument may also include accepting or setting a time threshold before which the next data will not be sampled. For example, the instrument may not start collecting the next data until 25% of the time for processing the current data has passed.

The next data is acquired in an operation 840, and the next data is processed, such as by frequency transform, in an operation 850. After the test and measurement instrument determines when to sample the next data, in an operation 860, the flow repeats to gather yet another set of sample data.

Although many of the embodiments described above include a user interface, it will be appreciated that in other embodiments, those parameters may alternatively be determined automatically by a test and measurement instrument Although the embodiments illustrated and described above show the present invention being used in a real-time spectrum analyzer, it will be appreciated that embodiments of the present invention may also be used advantageously in any kind of test and measurement instrument that displays frequency domain signals, such as a swept spectrum analyzer, a signal analyzer, a vector signal analyzer, an oscilloscope, and the like.

In various embodiments, components of the invention may be implemented in hardware, software, or a combination of the two, and may comprise a general purpose microprocessor, a digital signal processor (DSP), an application specific integrated circuit (ASIC), a field-programmable gate array (FPGA), or the like.

It will be appreciated from the forgoing discussion that the present invention represents a significant advance in the field of displays for frequency domain bitmaps. Although specific embodiments of the invention have been illustrated and described for purposes if illustration, it will be understood that various modifications may be made without departing from the sprit and scope of the invention. Accordingly, the invention should not be limited except as by the appended claims.

What is claimed is:
1. A test and measurement instrument comprising:
an input configured to receive an analog signal;
an analog-to-digital converter configured to convert the analog signal into a digitized signal;
a data sampler structured to acquire first sampled data from the digitized signal during a first data capture period;
a data processor structured to process the first sampled data during a data processing period, wherein the data processing period is longer in duration than the first data capture period such that a data capture gap is created between the first data capture period and a start time of a next data capture period;
a capture time adjustor structured to adjust the start time of the next data capture period to cause the next data capture period to begin within the data capture gap to enable capture of transient events that occur within the data capture gap, wherein the data sampler is structured to acquire second sampled data from the digitized signal during the next data capture period and the data processor is configured to process the second sampled data to enable identification of any transient events within the second sampled data.

2. The test and measurement instrument of claim 1, in which the data processor is a frequency transform processor structured to perform one or more frequency transforms on the first sampled data.

3. The test and measurement instrument of claim 1, in which the capture time adjuster is structured to adjust the start time of the next data capture period such that the second sampled data is fully acquired by the test and measurement instrument at least a period of time before the completion of the data processing period.

4. The test and measurement instrument of claim 1, in which the capture time adjustor includes a probability distribution function.

5. The test and measurement instrument of claim 4, in which the start time for the data sampler to acquire the second sample data is determined by the probability distribution function.

6. The test and measurement instrument of claim 5, in which the probability distribution function comprises a look-up table.

7. The test and measurement instrument of claim 5, in which the probability distribution function comprises a probability distribution function generator.

8. The test and measurement instrument of claim 4, in which the probability distribution function generates a Gaussian distribution.

9. The test and measurement instrument of claim 4, in which the probability distribution function generates a random distribution.

10. The test and measurement instrument of claim 3, in which the test and measurement instrument is structured to receive a user input designating the period of time.

11. A method in a test and measurement device, comprising:
receiving an analog signal;
converting the analog signal into a digitized signal via an analog-to-digital converter;
performing a first signal capture to acquire first sampled data from the digitized signal during a first data capture period;
performing a data process on the first sampled data during a data processing period, wherein the data processing period is longer in duration than the first data capture period such that a data capture gap is created between the first data capture period and a start time of a next data capture period;
adjusting the start time of the next data capture period to cause the next data capture period to begin within the data capture gap to enable capturing transient events that occur within the data capture gap;
performing a second signal capture to acquire second sampled data from the digitized signal during the next data capture period; and
performing the data process on the second sampled data to enable identification of any transient events within the second sampled data.

12. The method of claim 11 in which the data process is a frequency transform.

13. The method of claim 11, in which adjusting the start time of the next data capture period is based on a probability function.

14. The method of claim 13 in which the probability function is user selectable.

15. The method of claim 13, in which the probability function comprises a Gaussian distribution.

16. The method of claim 13, in which the probability function comprises a Laplace distribution.

* * * * *